United States Patent [19]
Sauer

[11] Patent Number: 5,754,056
[45] Date of Patent: May 19, 1998

[54] CHARGE DETECTOR WITH LONG INTEGRATION TIME

[75] Inventor: Donald Jon Sauer, Allentown, N.J.

[73] Assignee: David Sarnoff Research Center, Inc., Princeton, N.J.

[21] Appl. No.: 798,206

[22] Filed: Feb. 10, 1997

Related U.S. Application Data

[60] Provisional application No. 60/016,042 Apr. 23, 1996.

[51] Int. Cl.$^6$ .................................................. G01R 27/26
[52] U.S. Cl. ............................ 324/679; 324/678; 320/1
[58] Field of Search ................................ 324/548, 676, 324/678, 679; 320/1

[56] References Cited

U.S. PATENT DOCUMENTS

| | | | |
|---|---|---|---|
| 5,296,816 | 3/1994 | Birkinshaw | 324/457 |
| 5,479,103 | 12/1995 | Kernahan et al. | 324/678 X |
| 5,514,972 | 5/1996 | DeMoor et al. | 324/678 |
| 5,576,628 | 11/1996 | Caliboso et al. | 324/678 |
| 5,659,254 | 8/1997 | Matsumoto et al. | 324/678 |

OTHER PUBLICATIONS

Keith Birkinshaw, PhD., "Advances in multi–detector arrays for mass spectrometry—a LINK (JIMS) project to develop a new high-specification array", Trans Inst MC, pp. 149–162, vol. 16, No. 3, 1994 (month unavailable).

K. Birkinshaw, D.P. Langstaff, "Silicon technology in ion detection—a high resolution detector array", International Journal of Mass Spectrometry and Ion Processes, pp. 193–206, vol. 132, 1994 (month unavailable).

K. Birkinshaw, M. McGinnity, D. P. Langstaff, M. W. Lawton, D. M. Forbes, "A high resolution charge detector array on silicon", Sensors: Technology, Systems and Applications, IOP Publishing Ltd, 1991, pp. 421–426 (month unavailable).

*Primary Examiner*—Vinh P. Nguyen
*Assistant Examiner*—Glenn W. Brown
*Attorney, Agent, or Firm*—William J. Burke

[57] ABSTRACT

The invention relates to an apparatus and method for detecting electrical charge with a long integration time and in particular to a sampling method which reduces noise that affects the accuracy of the measurement of the total charge. The apparatus samples the charge on the capacitor at the start of the integration period to obtain a sample proportional to a first noise component. It then samples the charge on the capacitor at the end of an integration period and subtracts the noise component sample from the integrated charge sample to obtain a measure of integrated charge to the relative exclusion of the noise component. The circuit uses a folded cascode amplifier and at least one correlated double sampling circuit. The charge detector can be used with any apparatus which generates electrical charge in response to an input including for example, a photodetector, photomultiplier, ion detector, e beam detector and piezoelectric charge detector and arrays of such devices.

21 Claims, 9 Drawing Sheets

FIG. 9
DOUBLE CDS TIMING 5,754,056

1

CHARGE DETECTOR WITH LONG INTEGRATION TIME

This non-provisional U.S. national application, filed under 35 U.S.C. §111(a) claims, under 35 U.S.C. §119(e)(1), the benefit of the filing date of provisional U.S. application Ser. No. 60/016,042, filed under 35 U.S.C. §111(b) on Apr. 23, 1996.

The invention relates to an apparatus and method for detecting electrical charge over a long integration time and in particular to a sampling method that reduces noise which affects the accuracy of the measurement of the total charge.

BACKGROUND OF THE INVENTION

There exists a need for a method and apparatus for accurately measuring charge accumulated over a comparatively long period of time, for example 10–100 milliseconds, for use in instruments such as a low level light detector, ion detector, a photodetector, photomultiplier, e-beam detector and piezoelectric charge detector and arrays of such devices. For example, current state of the art mass spectrometers employ ion detector arrays which are hybrids composed of a microchannel electron multiplier array coupled to a phosphor screen which is then coupled to a photodiode array using fiber-optic plate and image format reducer. Due to the cost of the individual components and the added complexity of assembling them together, these detector arrays tend to be relatively expensive. The micro-channel plate also requires a high voltage accelerating field to produce secondary electron multiplication from electrons generated by the initial positive ion impact.

SUMMARY OF THE INVENTION

The invention is a method of measuring the charge on a capacitor connected to a source of reference potential comprising the steps of: measuring the reference voltage V1; measuring the voltage V2 on the capacitor after the capacitor is disconnected from the source of reference potential; subtracting V1 from V2 to produce a difference voltage V3; measuring the voltage V4 on the capacitor after an integration time; reconnecting the capacitor to the source of reference potential; measuring the voltage V5 on the capacitor a short time after the measurement of the reference potential; subtracting the voltage V4 from the voltage V5; summing the voltage V3 with the voltage difference between the voltages V4 and V5 to determine the voltage corresponding to the electrical charge stored on the capacitor.

The invention is also an apparatus for measuring the charge on a capacitor connected to a source of reference potential comprising: means for measuring the reference voltage V1; means for measuring the voltage V2 on the capacitor after the capacitor is disconnected from the source of reference potential; means for subtracting V1 from V2 to produce a difference voltage V3; means for measuring the voltage V4 on the capacitor after an integration time; means for reconnecting the capacitor to the source of reference potential; measuring the voltage V5 on the capacitor a short time after the measurement of the reference potential; means for subtracting the voltage V4 from the voltage V5; means for summing the voltage V3 to the voltage difference between the voltages V4 and V5 to determine the voltage corresponding to the electrical charge stored on the capacitor.

BRIEF DESCRIPTION OF THE DRAWING

The teachings of the present invention can be readily understood by considering the following detailed description in conjunction with the accompanying drawing, in which.

2

To facilitate understanding, identical reference numerals have been used, where possible, to designate identical elements that are common to the figures.

DETAILED DESCRIPTION

Figure 1:
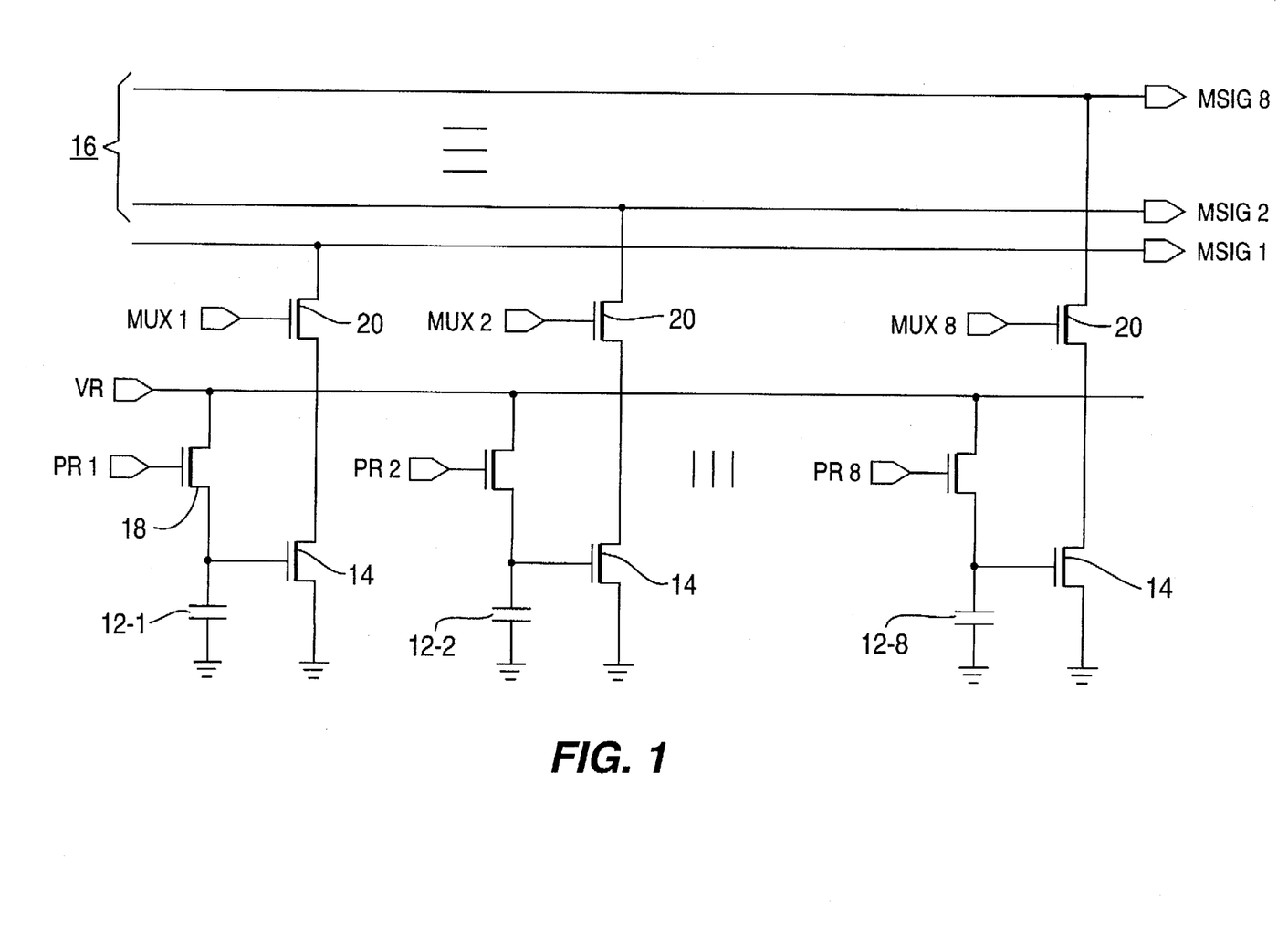
FIG. 1 is a schematic illustration of a circuit containing eight exemplary multiplexed charge collection circuits according to the invention.
Figure 2:
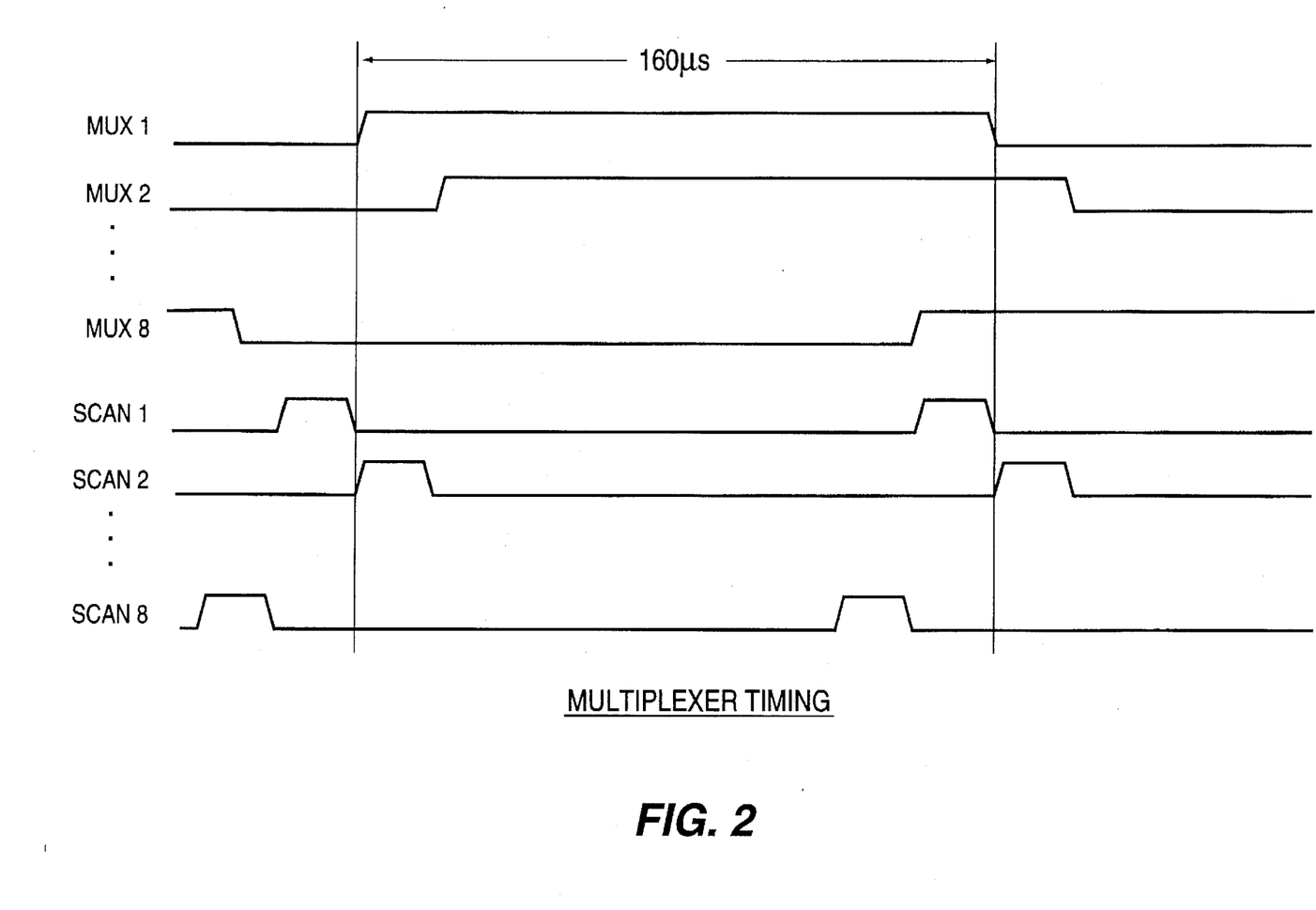
FIG. 2 is a timing diagram for the signals MUX1–MUX8 controlling the gates of the MOS switches of the circuit shown in FIG. 1.

The charge detector of the invention can be understood by its use in a particular instrument, here a solid state ion detector. In FIG. 1, the solid state ion detector consists of a linear array of metallic collecting electrodes 12-1 through 12-8 disposed on the surface of an integrated circuit which provides the functions of signal amplification, filtering and scanning for the linear array. Each metal electrode has a physical size of approximately 20 µm×2000 µm with a capacitance in the range of 0.5 pF. The gate of a low noise MOS transistor, configured as a source follower buffer 14, is connected to each electrode so that electric charge signals due to impinging positive ions can be buffered and multiplexed out to one of a set of horizontal signal lines 16. In the illustrative example shown schematically in FIG. 1, there are a total of eight multiplexed signal lines 16 (MSIG1–MSIG8) associated with a large group of electrodes, e.g., 512 electrodes. Each of the collecting electrodes 12 is also connected to a second MOS transistor 18 which is used to periodically reset the electrode to a reference potential $V_R$ prior to a specific signal integration period. The source electrode of the MOS source follower transistor 14 is connected to the multiplexed signal line via a third MOS transistor 20 controlled by a horizontal scanning shift register. The timing for the signals MUX1–MUX8 applied to the signal lines 16 which control the gates of these MOS transistors 20 is shown in FIG. 2.

Figure 3:
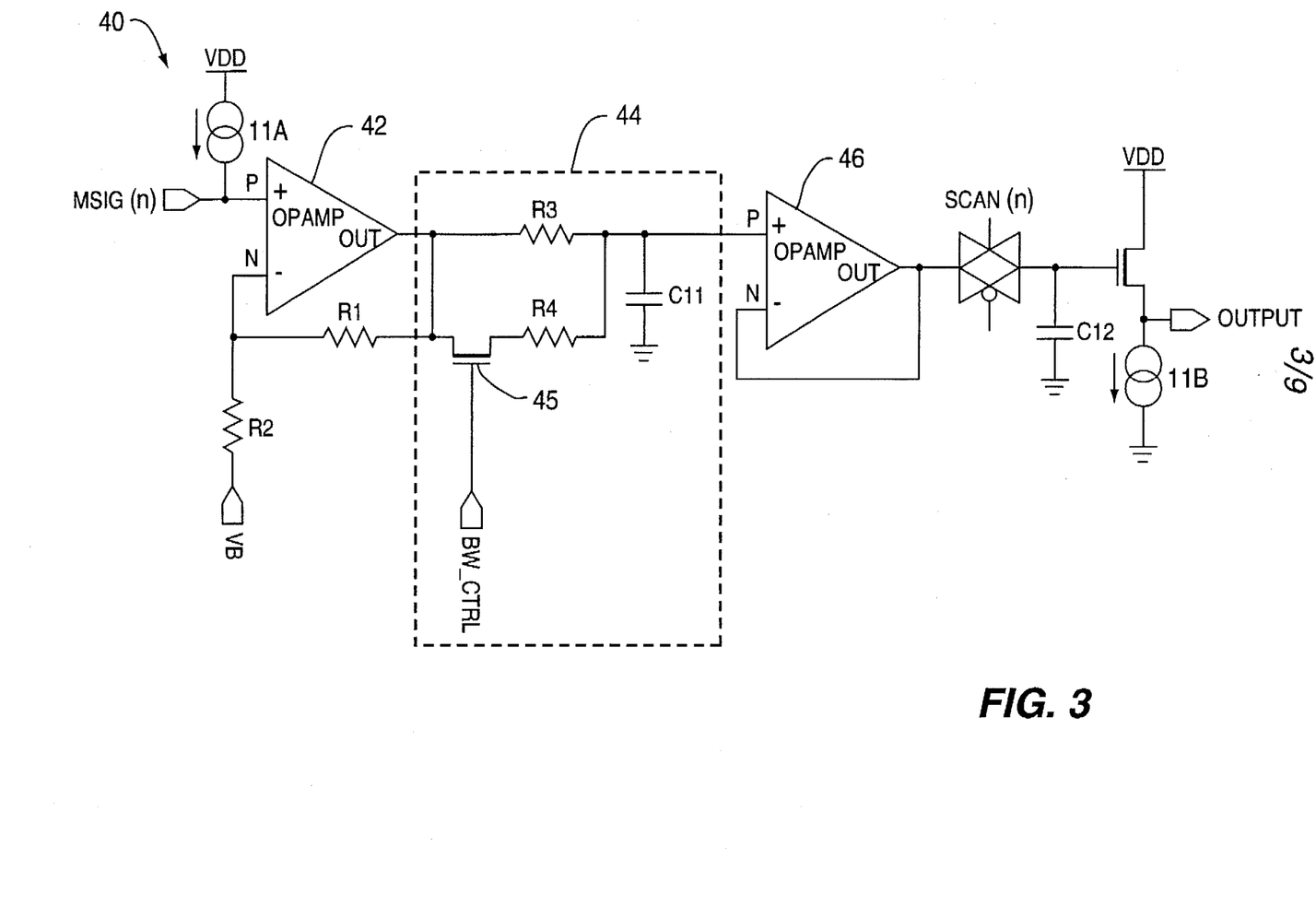
FIG. 3 is a schematic illustration of an amplifier and low pass filter circuit suitable for use with one of the charge collection circuits shown in FIG. 1.

Each multiplexed signal line feeds an amplifier and low pass filter circuit 40 which is shown in FIG. 3. This circuit includes an amplifier 42 with a voltage gain of about 10 followed by a low pass filter (LPF) 44 which reduces the noise level of the amplified signal. Additionally, the LPF employs a bandwidth switching control technique through transistor 45 to optimize the response time during signal acquisition while still restricting the noise bandwidth during the integration interval. The output signals from these eight amplifier/LPF circuits are combined into a single 50 kHz output signal and provided through buffer amplifier 46 to drive the final multiplexers. The exemplary amplifier 42 uses a very low noise folded cascode MOS operational amplifier shown in FIG. 4. The cascode circuit provides a low noise amplified signal. In the exemplary embodiment of the invention R1 is 1800 ohms and R2 is 200 ohms. A closed loop SPICE circuit simulation of this amplifier is shown in FIG. 5. For an input step 510 of 0.1 V the exemplary amplifier produces a 1 V output signal 512 and, thus, has a gain of 10.

Figure 4:
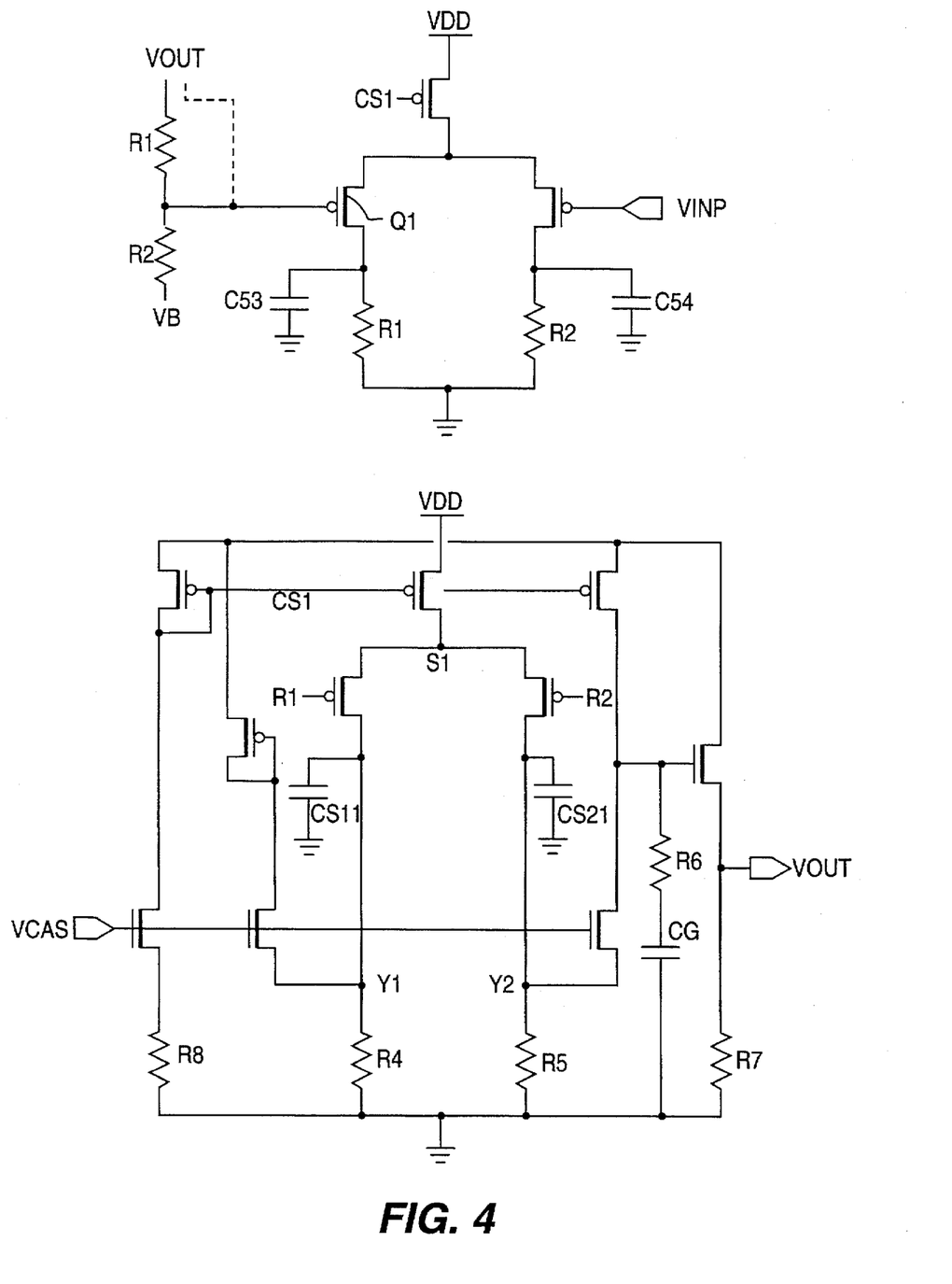
FIG. 4 is a schematic illustration of an exemplary folded-cascode MOS operational amplifier which may be used as the output amplifier 42 in the circuit shown in FIG. 3.
Figure 5:
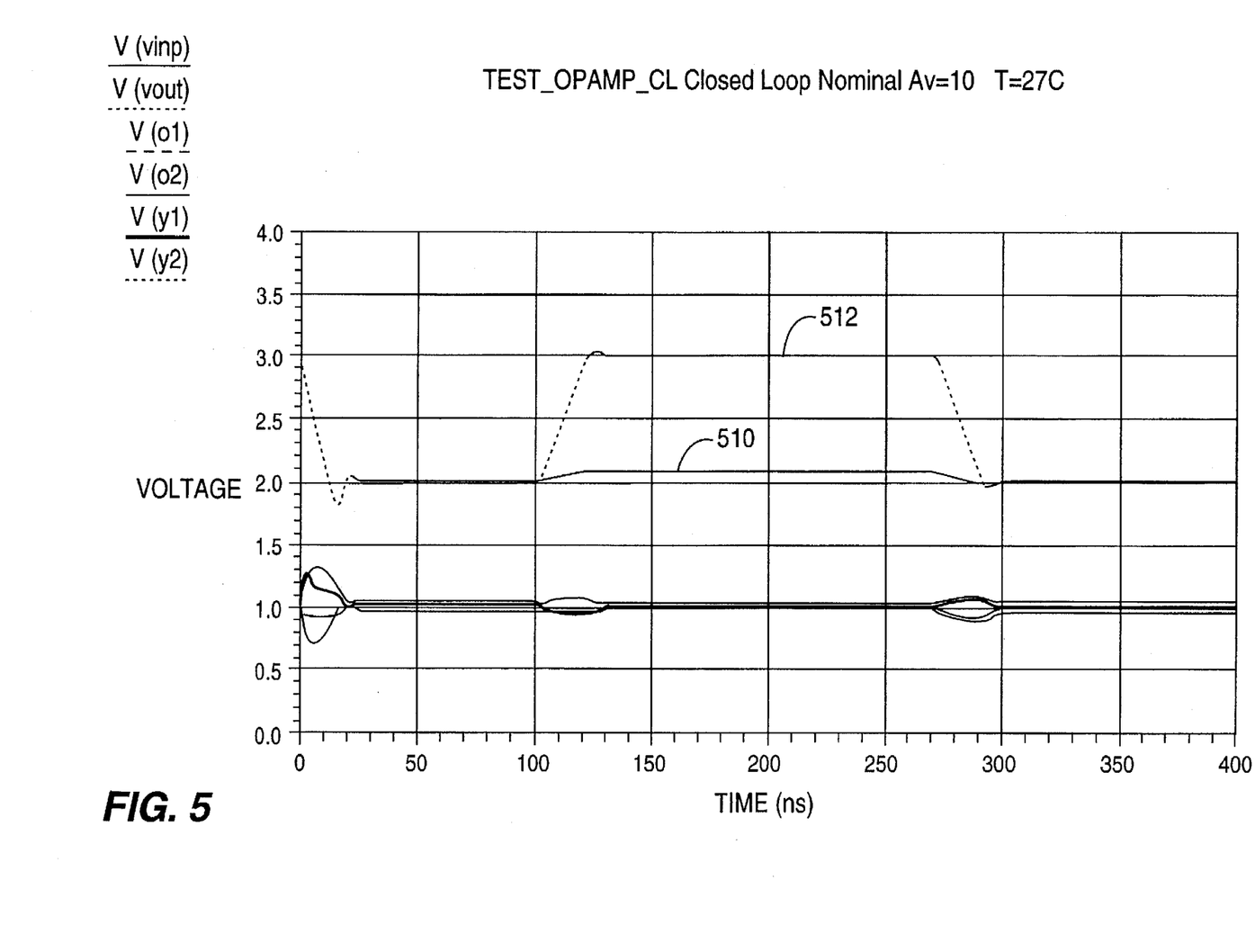
FIG. 5 is a waveform diagram which is useful for describing the operation of the amplifier of FIG. 4.

The amplifier circuit shown in FIG. 4 can also be used for the unity gain amplifier 46, shown in FIG. 3 by eliminating the resistors R1 and R2 and connecting the gate electrode of transistor Q1 directly to VOUT, as shown in phantom. Table 1 shows exemplary component values for the circuitry.

TABLE 1

| Current Sources | | Capacitors | |
|---|---|---|---|
| 11A | 2 mA | 12-1 through 12-8 | 0.5 pF |
| 11B | 1 mA | C11 | 500 pF |
| Resistors | | C12 | 50 pF |
| R1 | 1,800 Ω | C53 | 120 fF |
| R2 | 200 Ω | C54 | 120 fF |
| R3 | 20,000 Ω | CS11 | 100 fF |
| R4 | 1,000 Ω | CS21 | 100 fF |
| R5 | 1,000 Ω | CG | 5 pF |
| R6 | 1,000 Ω | | |
| R7 | 1,000 Ω | | |
| R8 | 2,000 Ω | | |

The advantage of providing multiple output signal lines is that the low pass filter bandwidth can be reduced by a factor of eight compared to that of a normal output scanner since the eight circuits are operating in parallel. Therefore, in the exemplary embodiment of the invention, the bandwidth of the LPF can be designed to be about 16 kHz (10μs time constant) since the total settling time available for each multiplexed signal line is 160 μs.

Figure 8:
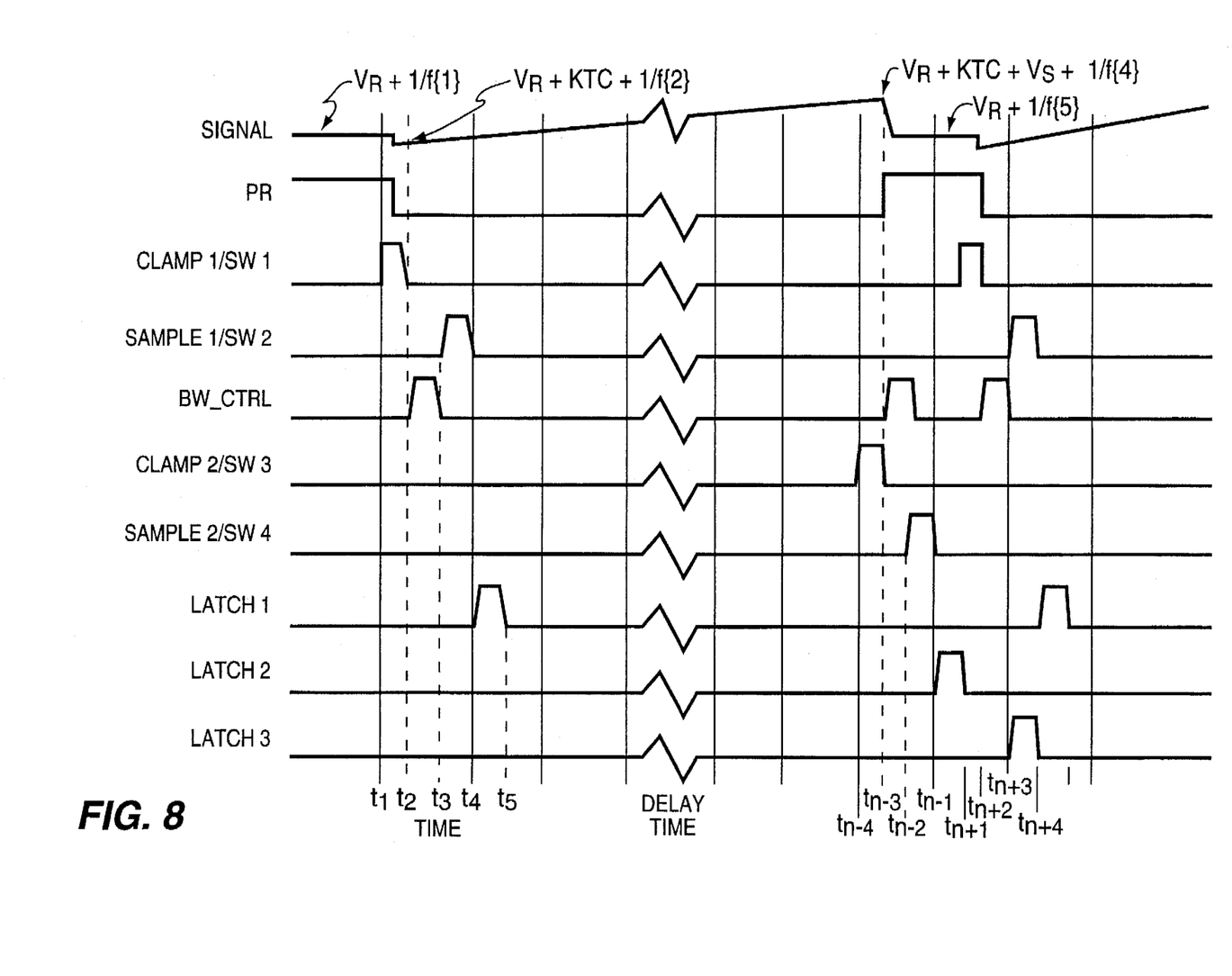
FIG. 8 is a graphical illustration of a timing diagram which is useful for describing the operation of the circuits shown in FIG. 7.

In order to remove the kTC noise component which is generated when the collecting electrodes are reset to $V_R$, and also to limit the 1/f noise components generated in the MOS source follower and operational amplifier, a new correlated sampling technique has been devised which is termed Double Correlated Double Sampling, or Double CDS (abbreviated DCDS). A timing diagram depicting the operation of the DCDS circuit is shown in FIG. 8. DCDS basically involves measuring differences between pairs of signals, wherein each is obtained using a conventional CDS circuit.

Figure 7:
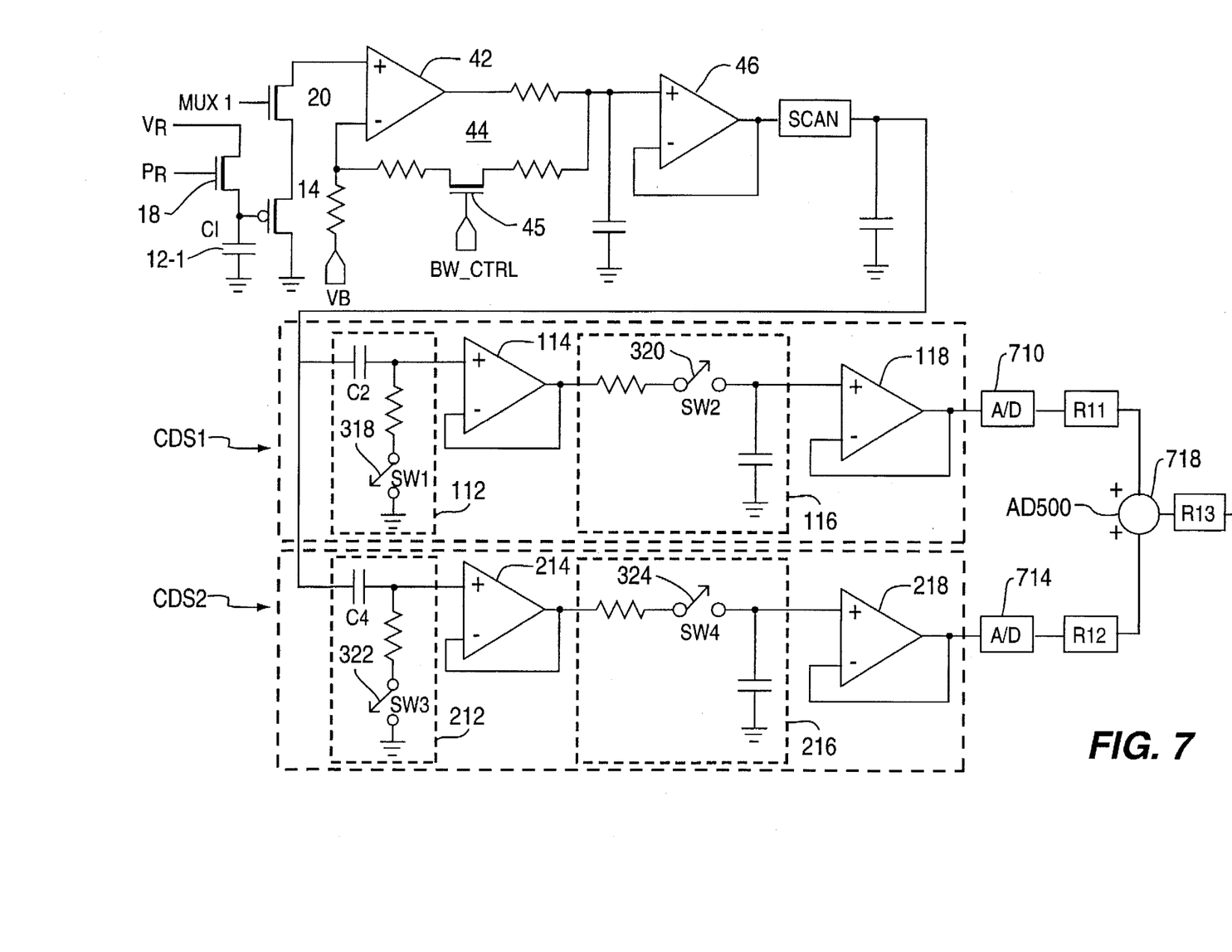
FIG. 7 is a schematic illustration of an apparatus for determining electrical charge with a long integration time.

Referring to FIG. 7 and FIG. 8, the first signal is the kTC reset noise which is measured before the detector integration time. This signal is measured using a CDS circuit that clamps the signal during the time period when PR is logic high, and then samples the clamped signal just after PR becomes logic low. The LPF filter bandwidth is narrow (e.g., 16 kHz) during the clamp period when PR becomes logic high which cuts off high frequency noise components above 16 kHz. When PR is logic low, however, the LPF bandwidth is switched to about 320 kHz for a period of 4 μs which allows rapid acquisition of the kTC component stored on the collecting electrode capacitance 12. The bandwidth of the LPF filter is then switched back to 16 kHz and the signal is sampled by the CDS circuit after a further delay of about 10 μs. During this interval, the wide band sampled noise level decays to the narrow band level. The CDS circuit therefore provides a LPF cutoff point of about 8 kHz below which the 1/f noise is rejected.

The second signal is the collected ion level which is measured at the end of the integration time using a CDS circuit. The LPF filter bandwidth is switched in a manner identical to that described above to assure that the kTC noise component is included in the measured signal. Then, the CDS circuit clamps to the ion signal level and samples the $V_R$ reference level when PR is logic high. Due to the inverse sense of the second signal, the kTC noise component is removed in the DCDS circuit by performing the algebraic sum of the first and second CDS signals.

Figure 6:
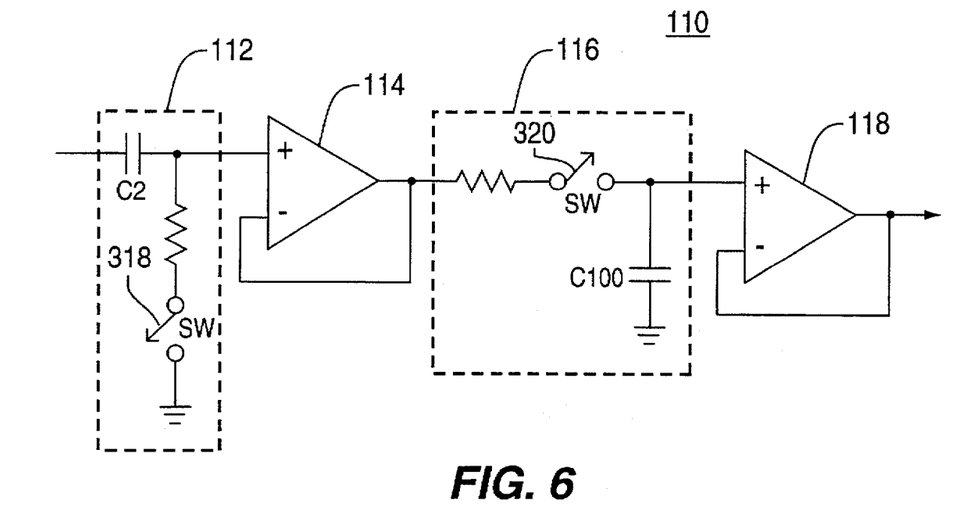
FIG. 6 is a schematic illustration of a CDS circuit suitable for use with the circuits shown in FIGS. 1 and 3.

In FIG. 6, a CDS circuit 110 includes a clamp circuit 112, an operational amplifier voltage follower 114, a sample-and-hold circuit 116, and an operational amplifier voltage follower 118.

Referring to FIGS. 7 and 8, there are seven basic steps in the double-correlate-double-sampling signal processing method which are used to extract a signal component −Vs in the presence of 1/f and kTC noise components. The first three steps are performed by the first CDS circuit and the fourth through sixth steps are performed by the second CDS circuit. These steps are:

1) First, the reset transistor 18 is turned on by the signal PR to reset the integrating capacitor $C_f$ which results in a reference voltage $V_R$ being applied to $C_f$. A sample V1 is taken when the reset transistor 18 is turned on (i.e. a conductive path exists between the source and the drain). If the instantaneous 1/f noise component of the source follower amplifier at this time is represented by 1/f {1}, then:

$$V1 = V_R + 1/f\{1\} \tag{1}$$

This input signal V1 is held by capacitor C2 to establish a clamp level in the clamp circuit 112 when the signal SW1 closes transmission gate 318 at time $t_1$. The stored signal in C2 remains at the level V1

2) Immediately after the reset transistor is turned off (i.e. a high impedance exists between the source and the drain) the LPF 44 briefly changes its frequency bandwidth, responsive to the signal BW_CTRL applied to the transistor 45. The bandwidth of the filter is changed to rapidly acquire the additional signal component kTC on $C_f$. Then, the sample V2 is taken. If the time between the samples V1 and V2 is small enough, then the instantaneous 1/f{2} noise is essentially the same as the 1/f{1} noise component, so that the V2 sample is given by equation (2).

$$V2 = V_R + 1/f\{2\} + kTC \approx V_R + 1/f\{1\} + kTC \tag{2}$$

3) After SW1 opens transmission gate 318 at time $t_2$, and SW2 closes transmission gate 320 at time $t_3$, the held input signal $V_R + 1/f\{f1\}$ is subtracted from the current signal, $V_R + kTC + 1/f\{1\}$, to give an output signal of kTC. This is represented by equation 3. Thus, V1 is subtracted from V2 to obtain the kTC noise component (this is the 1st CDS operation) as shown in equation (3).

$$V3 = V2 - V1 = kTC \tag{3}$$

The output signal V3 is held in the sample and hold circuit 116, and so remains kTC after SW2 opens transmission gate 320 at time $t_4$. This signal does not change until SW2 closes transmission gate 320 again. Amplifiers 114 and 118 may be conventional unity gain amplifiers. The output signal, V3 is then sent to an analog to digital (A/D) converter 710. The positive going transition of the signal latch 1, at time $t_4$, triggers the A/D converter connected to CDS1. An A/D converter which operates at a frequency of 100 kHz may be used. The negative going transition of latch 1, at time $t_5$ triggers register R11 causing it to store the output value provided by A/D converter 710. Register R11 then stores the digital value corresponding to the output signal V3 which is equal to kTC.

4) After a period of signal integration, a sample V4 is taken as represented by equation (4). If the instantaneous 1/f noise component of the source follower amplifier at this time is represented by 1/f{4}, then:

$$V4=V_R+1/f\{4\}+kTC+Vs \tag{4}$$

This signal V4, which is equal to $V_R+1/f\{4\}+kTC+V_S$, is held by capacitor C4 to establish a clamp level in the clamp circuit 212 when the signal SW3 closes transmission gate 322 at time $t_{n-4}$. The stored signal remains at this level V4. Before the sample V5 is taken, at time $t_{n-2}$, the LPF 44 briefly increases its cutoff frequency at time $t_{n-3}$ to allow rapid acquisition of the signal V5.

5) The reset transistor is turned on again at time $t_{n-3}$ and a final sample V5 is taken a short time following the V4 sample (at time $t_{n-2}$) so that 1/f{5} is essentially equal to 1/f{4} as shown by equation (5).

$$V5=V_R+1/f\{5\}\approx V_R+1/f\{4\} \tag{5}$$

6) After SW3 opens transmission gate 322 at time $t_{n-3}$ and the signal SW4 closes transmission gate 324 at time $t_{n-2}$, the held input signal $V_R+kTC+V_S+1/f\{4\}$ is subtracted from the current signal, $V_R+1/f\{4\}$, to give an output signal of $-(kTC+V_s)$. Thus, V4 is subtracted from V5 by buffer amplifier 218 to obtain the signal $-(Vs+kTC)$ as shown in equation (6).

$$V6=V5-V4=-(kTC+Vs) \tag{6}$$

The output signal, V6, is held in the sample and hold circuit 216, and so remains $-(kTC+V_S)$ after SW4 opens transmission gate 324 at time $t_{n-1}$. This signal does not change until the signal SW4 closes transmission gate 324 again. Amplifiers 214 and 218 may be conventional unity gain amplifiers. The output signal referred to as V6 which is equal to $-(kTC+V_S)$ above, is then sent to an A/D converter 714. The positive going transition of the signal latch 2, at time $t_{n-1}$, triggers the A/D converter connected to CDS2. The negative going transition of latch 2, at time $t_{n+1}$, triggers register R12, which stores the digital value V6 (i.e. $-(kTC+V_S)$).

7) To obtain the signal component, $-Vs$, the digital value V3 is added to the digital value V6 by adder 718 in equation (7) to obtain:

$$V7=V6+V3=-Vs \tag{7}$$

The positive going transition of latch 3, at time $t_{n+3}$, triggers register R13. The output value of adder 718 is stored in register R13. Register R13 stores the signal $-V_S$ which represents the output signal of the charge detector after an integration period. Of course, the signals latch 2 and latch 3 occur after an integration period. It is desirable that latch 3 is triggered quickly enough after V6 is stored so that R13 can store information before CDS1 starts again. In order to achieve this, one may delay the time PR is held logic high or use a higher frequency A/D converter circuit(s) for CDS2 and for CDS1, or for both CDS1 and CDS2 if a single converter is used. The second cycle can start as early as at time $t_{n+1}$.

Figure 9:
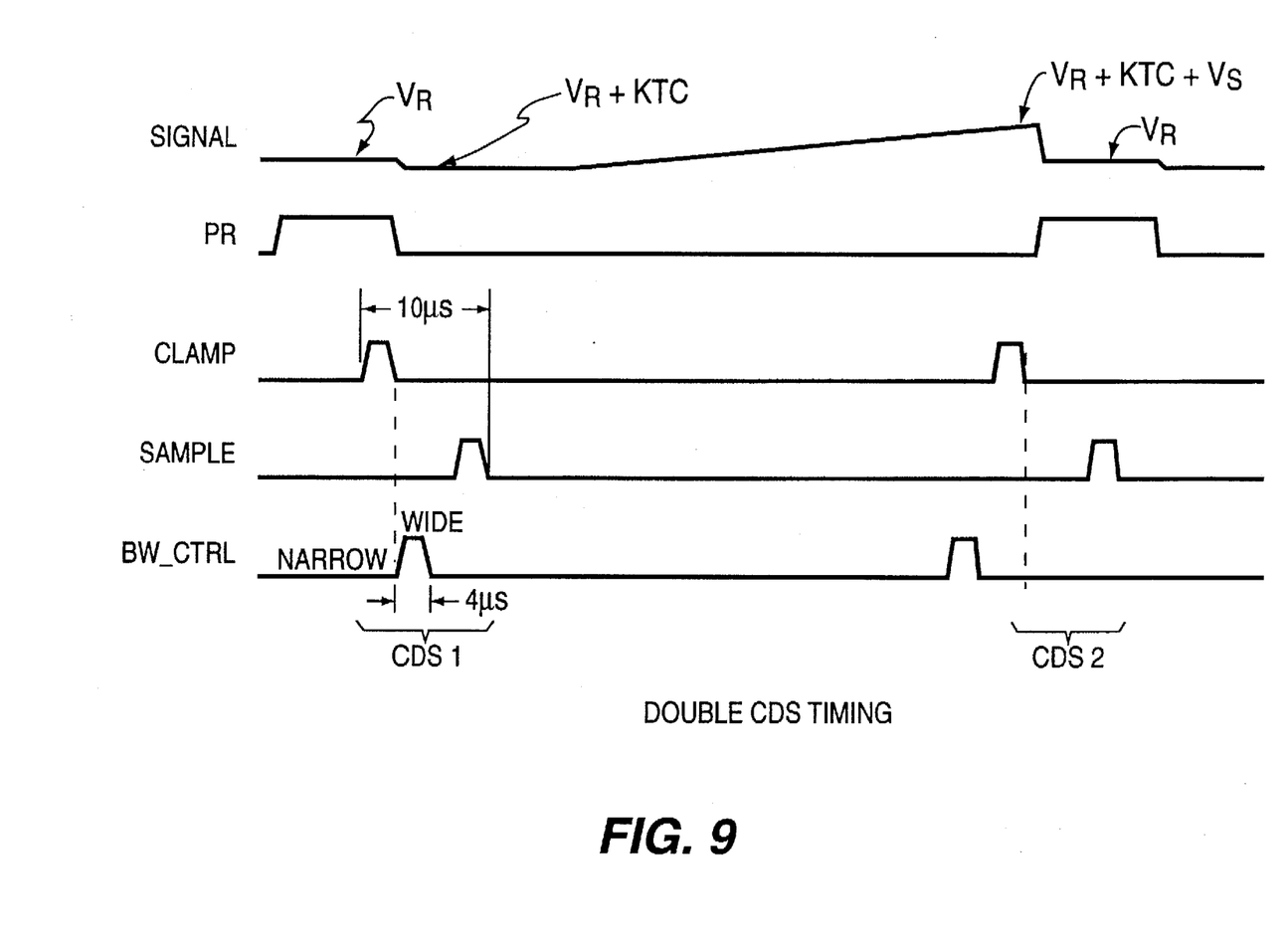
FIG. 9 is a graphical illustration of a timing diagram depicting the operation of a circuit similar to that shown in FIG. 7, except using only one analog to digital converter.

If one A/D converter is used it may be desirable to use one which operates at a higher sample frequency. Transmission gates or switches may be used to switch the one A/D from CDS1 to CDS2. Also, the operations performed by this circuit may be implemented using only one CDS circuit as shown in FIG. 9. Using two CDS circuits, however, typically results in a $-V_S$ signal which has less noise than if only one CDS circuit is used.

Figure 10:
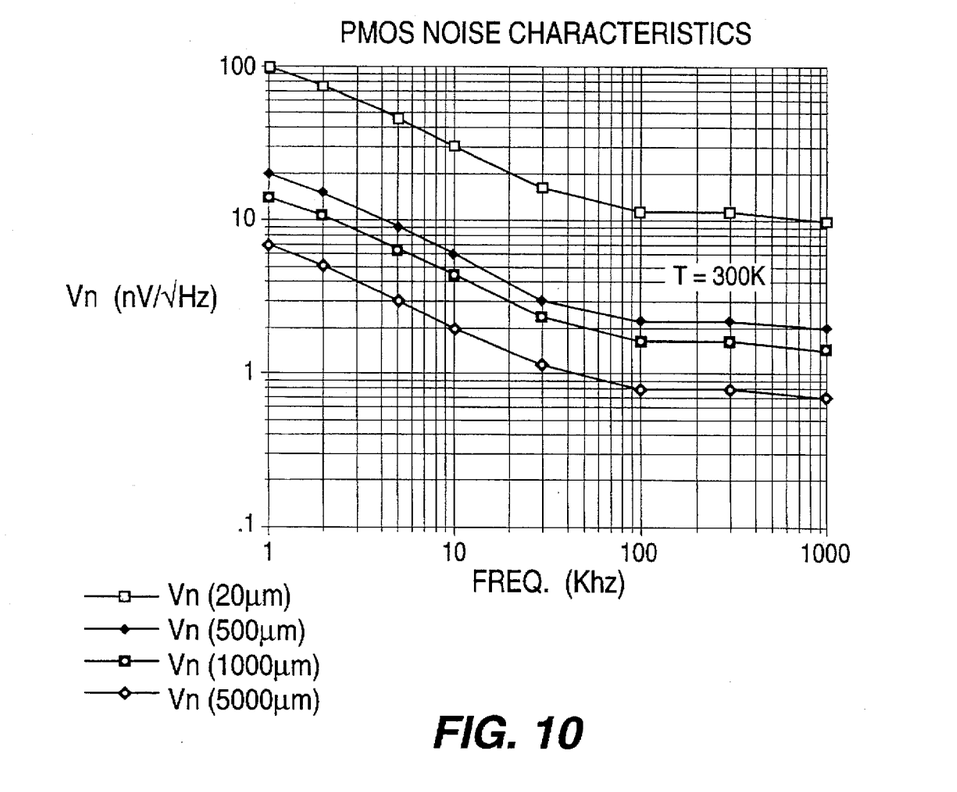
FIG. 10 is a graphical illustration of the typical noise characteristics of a 20/1.5 µm PMOS transistor.

FIG. 10 shows the typical noise characteristics for an exemplary 20/1.5 μm PMOS transistor measured at an Ids current of 200 μA and the estimated noise characteristics for an exemplary PMOS device having a 1000 μm width is used for the 1st source follower, the input capacitance of the source follower is on the order of 0.5 pF, so the total collection electrode capacitance is approximately 1 pF. For an LPF filter bandwidth of 16 kHz, and based on the component sizes shown in FIGS. 3 and 4, the magnitudes of the individual noise terms referred to the detector node are calculated as follows:

$$VN(\text{Source Follower}) = 3\,nV/\sqrt{Hz} * \sqrt{16\,kHz} = 0.38\,\mu V \tag{8}$$

$$Vn(\text{Opamp}) = \sqrt{2} * 1.5\,n/\sqrt{Hz} * \sqrt{16\,kHz} = 0.27\,\mu V \tag{9}$$

$$Vn(R1,20k) = \sqrt{(4KT*20K*16\,kHz)/10} = 0.23\,\mu V \tag{10}$$

$$VN(R2,200) = \sqrt{(4KT*200*16\,kHz)} = 0.16\,\mu V \tag{11}$$

where k=1.38E−23 J/K and T=300K
The quadrature sum of these noise terms is:

$$Vn(\text{total})=0.54\mu V\,\text{rms} \tag{12}$$

For a 1 pF detector capacitance, the equivalent noise in electrons at the detector is:

$$Qn=C*Vn(\text{tot})/q=3.4\,\text{electrons rms} \tag{13}$$

Another aspect of this invention is that by choosing the reset potential VR to be equal to the substrate potential of the MOS reset transistor, the diode leakage dark current is essentially zero. This can be seen directly from the current for a p-n junction diode given by: $I=Is\,(e^{-qV/kT}-1)$ where Is is the reverse saturation current. Therefore, if V<<kT/q then the shot noise due to the dark current is negligible.

It is to be understood that the apparatus and method of operation taught herein are illustrative of the invention. Modifications may readily be devised by those skilled in the art without departing from the spirit or scope of the invention. The invention can be used with any number of capacitors. Although the invention was illustrated with eight lines multiplexed together, any number can be used. The charge detector can be used with any apparatus which generates electrical charge in response to an input including for example, a photodetector, photomultiplier, ion detector, electron beam detector and piezoelectric charge detector and arrays of such devices. The invention is directed to an integrated solid state charge detector array having a long integration time and which can be manufactured at relatively low cost using conventional silicon IC processing. It is also desirable that this detector have low level sensitivity approaching a single ion event (such as may be achieved with the microchannel multiplier array), and yet have improved dynamic range capability as compared to the prior art.

What is claimed:

1. A method of measuring a charge integrated on a capacitor during a time interval comprising the steps of:
    connecting a capacitor to a source of reference potential at the start of the time interval, measuring a voltage V1 on the capacitor, disconnecting the capacitor from the source of reference potential, measuring a voltage V2 after the capacitor is disconnected from the source of reference potential;

subtracting V1 from V2 to obtain a voltage V3;

measuring a voltage V4 on the capacitor after the integration time;

reconnecting the capacitor to the source of reference potential;

measuring a voltage V5 on the capacitor a short time after connecting the capacitor to the reference potential;

subtracting the voltage V4 from the voltage V5 to produce a voltage V6;

summing the voltage V3 and the voltage V6 to obtain a voltage corresponding to the integrated charge.

2. The method of claim 1 wherein said steps of subtracting sample value V1 from sample value V2 and subtracting V4 from V5 both are accomplished by using a correlated double sampling circuit.

3. The method of claim 1 wherein said steps of measuring V1 and V2 are accomplished by using an adaptive low pass filter (LPF) having at least two cut-off frequencies, a lower cut-off frequency, and a higher cut-off frequency, and said LPF operates at the lower cut-off frequency when the voltage V1 is measured and said LPF operates at the higher cut-off frequency when the voltage V2 is measured.

4. The method of claim 1 wherein the signal V1 is equal to $V_R+1/f\{1\}$, V2 is equal to $V_R+kTC+1/f\{2\}$, V4 is equal to $V_R+kTC+Vs+1/f\{4\}$, and V5 is equal to $V_R+1/f\{5\}$, wherein $1/f\{x\}$ components are equal to the instantaneous noise component of the source follower amplifier for sample values V1, V2, V4, and V5, respectively, and $V_R$ is equal to a voltage corresponding to the reference potential, kTC is equal to a voltage corresponding to a noise component, and $V_S$ is equal to a voltage corresponding to the integrated charge.

5. The method of claim 1 further comprising the steps of digitizing and storing both V3 and V6, and the step of summing V3 and V6 sums the stored digital values to produce a digital output value corresponding to the integrated charge.

6. An apparatus for measuring the charge integrated on a capacitor during a time interval comprising:

means for selectively connecting the capacitor to a source of reference potential;

means for obtaining a sample value V1, said sample value V1 being proportional to the reference voltage;

means for obtaining a sample value V2 from the capacitor after the capacitor is disconnected from the source of reference potential, said sample value V2 being proportional to the reference voltage stored in the capacitor plus a noise component;

means for subtracting sample value V1 from sample value V2 to produce a sample value V3 being proportional to the noise component;

means for obtaining a sample value V4 from the capacitor, said sample value V4 being proportional to the charge on the capacitor after the integration time interval;

means for obtaining a sample value V5, said sample value V5 being proportional to the voltage stored in the capacitor a short time after reconnecting the capacitor to the reference;

means for subtracting the sample value V5 from the sample value V4 to produce a sample value V6;

means for summing the sample value V3 and the sample value V6 to produce an output sample value corresponding to the electrical charge stored on the capacitor during the integration time interval to the substantial exclusion of any noise components.

7. The apparatus of claim 6 wherein the means for obtaining sample value V1 and sample value V2 and for subtracting sample value V1 from sample value V2 and the means for obtaining sample value V4 and sample value V5 and for subtracting sample value V4 from sample value V5 both include a correlated double sampling circuit.

8. The apparatus of claim 7 wherein the means for measuring sample value V4 and sample value V5 include an adaptive low pass filter (LPF) for reducing noise in the measured values, the LPF having at least two cut-off frequencies, a lower cut-off frequency, and a higher cut-off frequency, and said LPF operates at the lower cut-off frequency when the sample value V4 is measured and said LPF operates at the higher cut-off frequency when the sample value V5 is measured.

9. The apparatus of claim 6 wherein the means for obtaining sample value V1 and sample value V2 and the means for obtaining sample values V4 and V5 each include a folded cascode amplifier.

10. The apparatus of claim 6 wherein the signal V1 is equal to $V_R+1/f\{1\}$, V2 is equal to $V_R+kTC+1/f\{2\}$, V4 is equal to $V_R+kTC+Vs+1/f\{4\}$, and V5 is equal to $V_R+1/f\{5\}$ wherein $1/f\{x\}$ is equal to the instantaneous noise component of the source follower amplifier for sample values V1, V2, V4, and V5, respectively, and $V_R$ is equal to a voltage corresponding to the reference potential, kTC is equal to a voltage corresponding to a noise component, and $V_S$ is equal to a voltage corresponding to the integrated charge.

11. The apparatus of claim 6 which further comprises a means for digitizing and storing both V3 and V6.

12. An apparatus for measuring an amount of electric charge integrated on a capacitor between first and second instants comprising:

the capacitor, a reference potential setting circuit which is electrically coupled to the capacitor, an amplifier network and a filter which are electrically coupled to receive a signal proportional to the charge stored on the capacitor;

at least one correlated double sampling circuit electrically coupled to the amplifier network to form a difference value which represents a difference between signals provided by the amplifier at first and second instants;

at least one analog to digital converter electrically coupled to receive and digitize the difference value from the correlated double sampling circuit;

at least one register electrically coupled to the analog to digital converter to hold the digitized difference value, and a summing circuit coupled to the register to add the digitized difference value to a previously stored digitized difference value.

13. The apparatus according to claim 12 which further comprises a plurality of capacitors and multiplexers which selectively couple each of the capacitors to the amplifier network.

14. The apparatus according to claim 12 further comprises eight multiplexers each coupling a plurality of capacitors to a respective amplifier network.

15. The apparatus according to claim 12 wherein the filter controls the bandwidth of the amplifier network by increasing the cut-off frequency of a low pass filter (LPF) to acquire kTC wherein kTC is equal to a voltage corresponding to a noise component.

16. The apparatus according to claim 15 wherein the bandwidth of the amplifier network by switching the LPF from a cut off frequency of 16 kHz to a cut off frequency of 320 kHz and back to the cut off frequency of 16 kHz.

17. The apparatus according to claim 12 wherein there are two CDS circuits and two analog to digital converters.

18. The apparatus according to claim 12 wherein each analog to digital converter operates at a frequency between 100 kHz and 200 kHz.

19. The apparatus according to claim 12 wherein the amplifier network includes at least one folded cascode amplifier.

20. The apparatus according to claim 12 wherein there are three registers.

21. The apparatus according to claim 12 wherein the reference potential circuit comprises a MOS transistor having a substrate potential and the reference potential is equal to the substrate potential.

* * * * *